(12) United States Patent
Terauchi et al.

(10) Patent No.: US 7,662,537 B2
(45) Date of Patent: Feb. 16, 2010

(54) LITHOGRAPHIC PRINTING ORIGINAL PLATE AND LITHOGRAPHIC PRINTING PLATE

(75) Inventors: Tomoya Terauchi, Sodegaura (JP); Yuji Inatomi, Sodegaura (JP); Toshinori Matsuda, Sodegaura (JP); Yuko Kobayashi, Tokyo (JP); Akihiro Koide, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 233 days.

(21) Appl. No.: 10/584,185

(22) PCT Filed: Dec. 24, 2004

(86) PCT No.: PCT/JP2004/019314

§ 371 (c)(1),
(2), (4) Date: Jun. 23, 2006

(87) PCT Pub. No.: WO2005/063498

PCT Pub. Date: Jul. 14, 2005

(65) Prior Publication Data

US 2007/0190446 A1 Aug. 16, 2007

(30) Foreign Application Priority Data

Dec. 26, 2003 (JP) .............................. 2003-432878

(51) Int. Cl.
G03C 1/00 (2006.01)
G03F 7/26 (2006.01)
(52) U.S. Cl. .................................... 430/270.1; 430/302
(58) Field of Classification Search ............. 430/270.1, 430/302; 101/465, 466, 130
See application file for complete search history.

(56) References Cited

U.S. PATENT DOCUMENTS

| 4,209,581 | A | * | 6/1980 | Takanashi et al. ........ 430/283.1 |
| 5,379,698 | A | | 1/1995 | Nowak et al. |
| 6,093,509 | A | * | 7/2000 | Isono et al. .................... 430/18 |
| 6,387,588 | B1 | | 5/2002 | Katano et al. |
| 6,558,870 | B1 | * | 5/2003 | Kawahara et al. ........ 430/270.1 |
| 2002/0192590 | A1 | | 12/2002 | Mase et al. |

FOREIGN PATENT DOCUMENTS

| EP | 0 755 803 A1 | 1/1997 |
| EP | 0 773 113 A1 | 5/1997 |
| JP | 52-76397 | 6/1977 |

(Continued)

*Primary Examiner*—Cynthia H Kelly
*Assistant Examiner*—Connie P Johnson
(74) *Attorney, Agent, or Firm*—Birch, Stewart, Kolasch & Birch, LLP

(57) ABSTRACT

An object of the present invention is to provide a lithographic printing plate with a hydrophilic layer mainly made from resins which has a photosensitivity to the light in near infrared region, on which images can be printed directly with laser beam, requiring no development and wiping off operation, and immediately recovering from ink stains without any difficulties when an ink attaches to non-image areas on printing, and a photosensitive resin composition applied to the printing plate.

A lithographic printing original plate having a photosensitive layer formed on a support is characterized in that the surface of the photosensitive layer has a phase-separation structure, and the recessed parts are formed on the surface of a photosensitive layer by the dissolution of one component of photosensitive layer constituting the phase-separation and the surface of the photosensitive layer is changed to have affinity for ink by irradiation with light.

5 Claims, 3 Drawing Sheets

FOREIGN PATENT DOCUMENTS

| | | |
|---|---|---|
| JP | 7-1850 A | 1/1995 |
| JP | 7-314934 A | 12/1995 |
| JP | 8-282142 A | 10/1996 |
| JP | 9-127683 A | 5/1997 |
| JP | 9-171249 A | 6/1997 |
| JP | 2000-122271 A | 4/2000 |
| JP | 2001-18547 A | 1/2001 |
| JP | 2001-033590 A | 2/2001 |
| JP | 2001-109141 A | 4/2001 |
| JP | 2002-362052 A | 12/2002 |
| WO | WO-01/83234 A1 | 11/2001 |

* cited by examiner

[Figure 1]
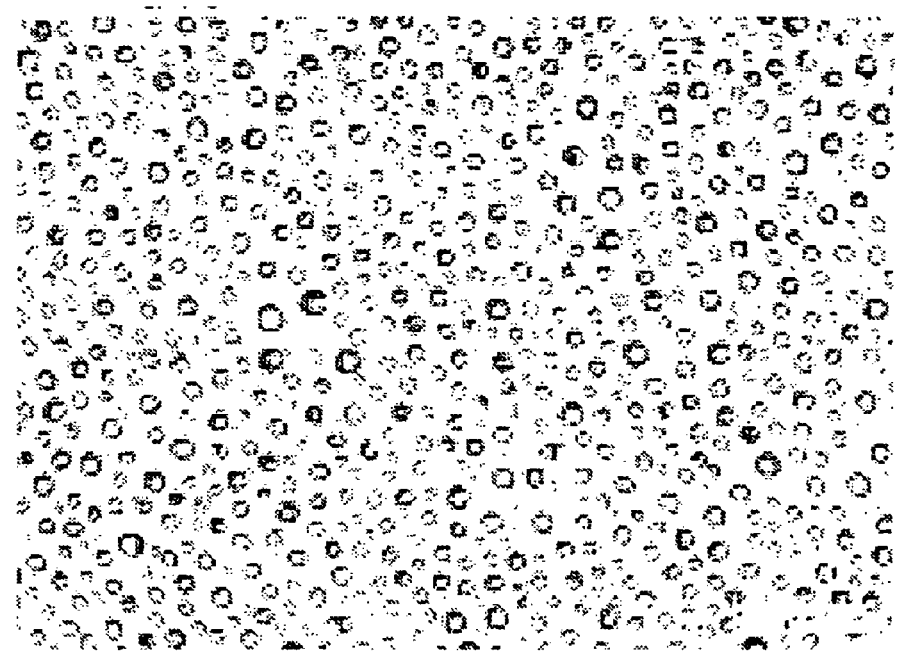
[Figure 2]
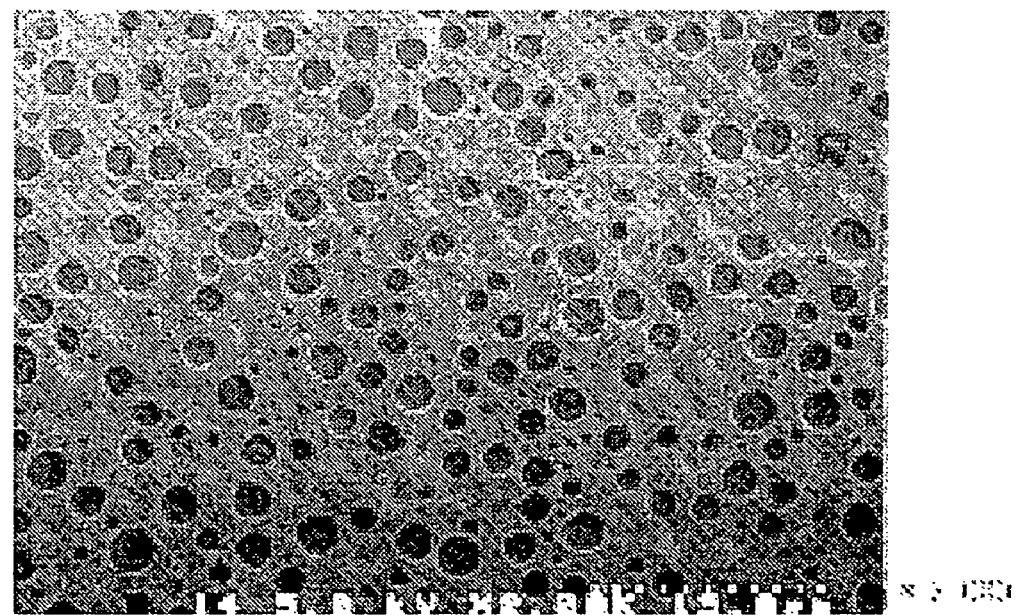

[Figure 3]
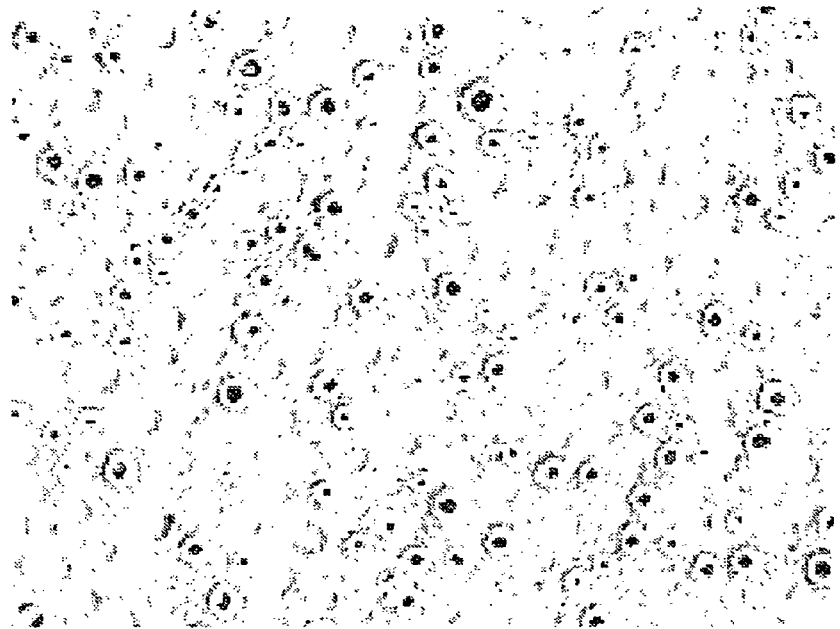
[Figure 4]
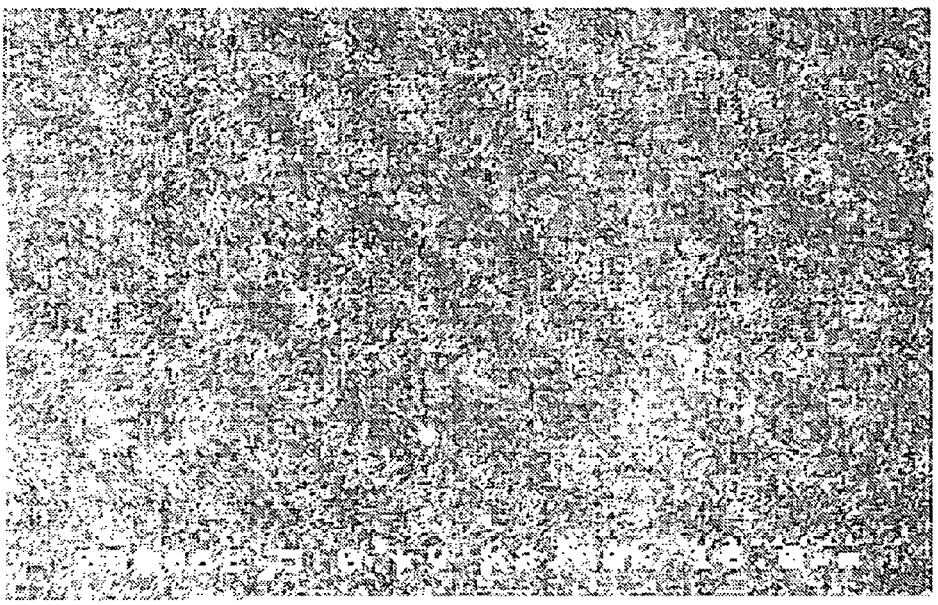

[Figure 5]
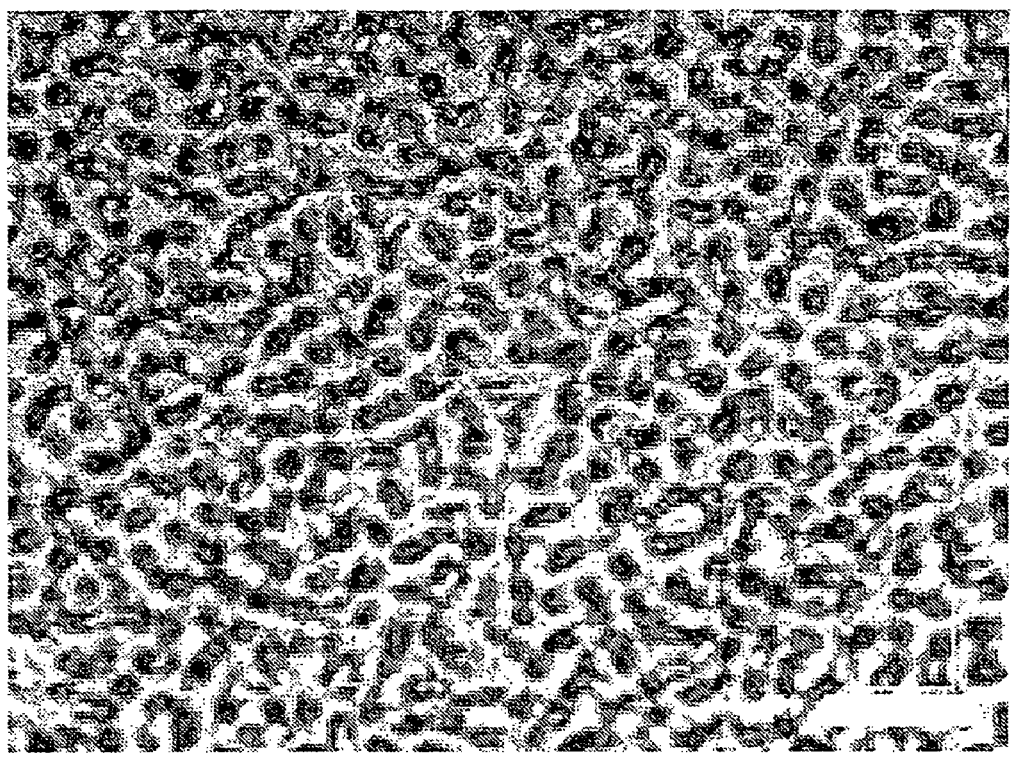

LITHOGRAPHIC PRINTING ORIGINAL PLATE AND LITHOGRAPHIC PRINTING PLATE

TECHNICAL FIELD

The present invention relates to a lithographic printing original plate, particularly a lithographic printing original plate using wetting water (fountain solution), more particularly, a lithographic printing original plate which is sensitive to the light in near-infrared region and provides images directly on the plate by laser beam irradiation, and a lithographic printing plate which is obtained by irradiation with light or thermal energy on the lithographic printing original plate.

BACKGROUND OF THE INVENTION

A lithographic printing plate is a printing plate which is used for lithographic printing. The surface of the printing plate consists of image areas to which an ink is received and non-image areas which do not receive an ink and repel. In general, the non-image areas form a surface where water is adsorbed and kept thereon. In an actual printing process, the non-image areas is firstly provided with water to repel an ink. Thus, in a lithographic printing plate, the non-image areas are made of a hydrophilic material whose characteristics influence greatly the performance of the lithographic printing plate.

A printing plate most widely used as a lithographic printing plate is generally called as "PS-plate". The PS-plate uses an anode-oxidized aluminum plate whose surface is sandblasted as a hydrophilic material, and a layer of an ink-receiving photosensitive material is formed on the anode-oxidized aluminum plate. The PS-plate is exposed to light corresponding to an original image, and the photosensitive material except for those in image areas is eliminated to expose the underlying hydrophilic aluminum surface so that an image consisting of image areas and non-image areas is formed on the printing plate.

The process in which the photosensitive layer is eliminated after exposure to light is called as development. Because in the development process, generally an alkaline solution or an organic solvent is used as a developer, disposal of the developer waste has loaded a heavy burden on printing operation. Particularly in recent years, with increasing awareness of environmental problems, it is requested for the developer waste to be disposed in environmentally completely harmless state. In addition, an exclusive apparatus is required for development. From the standpoint of the problems of high installation cost of such apparatus or requirement of keeping sufficient working space, a printing plate that does not require development process is requested.

As a plate that does not require development process, for example, a plate whose non-image areas comprises a hydrophilic swelling layer is disclosed in Patent Document 1 (Japanese Patent Laid-open publication No. 282142/1996). This plate, after the hydrophilic swelling layer is formed, acquires photosensitivity by absorbing photosensitive materials in the hydrophilic swelling layer. The image areas lose hydrophilicity as the result of reaction of the photosensitive materials contained in the hydrophilic swelling layer through exposure to light. However, in this method, unnecessary photosensitive materials remain in the non-image areas, so that the problem of requiring a rinsing process still remains, where the photosensitive materials in the non-image areas are rinsed off after exposure to light.

Patent Document 2 (Japanese Patent Laid-open publication No. 314934/1995) discloses a plate having a constitution where an ink-repelling layer made of a silicone resin is superimposed on an inorganic light-absorbing layer of titanium or titanium oxide and the like. In this plate, the silicone resin layer repels an ink to form non-image areas, and image areas are formed by irradiation of near-infrared light. On printing, the silicone resin layer is eliminated after irradiation with light so as to expose the support surface having affinity to ink. In order to eliminate the silicone resin completely, wiping off operation is required. When the silicone resin is wiped off incompletely, the ink is not sufficiently adhered to the irradiated portion and defects are formed in the image areas, leading to a drawback of imperfect printing.

Further, Patent Document 3 (Japanese Patent Laid-open publication No. 109141/2001) discloses a printing plate having a hydrophilic layer to which a water-soluble polymer compound is added. This plate employs a so-called ablation mechanism in which the hydrophilic layer is irradiated with laser beam to cause, by thermal energy, chemical reactions such as burning, dissolution, decomposition, vaporization or explosion or physical changes in the irradiated portion of the hydrophilic layer, and as a result, the adhesion of the irradiated portion of the hydrophilic layer is lowered so as to eliminate selectively the portion irradiated with laser beam. This method still has such a problem of requiring a wiping off operation with a water-swollen pad and the like.

In recent years, a method called on-press development has been proposed, in which development process is carried out in printing machines on site. In the on-press development method, unnecessary portion after exposure to light is eliminated in printing machines, without using developer, with a fountain solution or by mechanical contact with an impression drum or a blanket drum in the machine. For example, Patent Document 4 (Japanese Patent Laid-open publication No. 127683/1997) and Patent Document 5 (Japanese Patent Laid-open publication No. 171249/1997) disclose plates having a hydrophilic support with a photosensitive layer containing water-dispersing thermoplastic resin particles that become to have an affinity to ink by melting and welding through exposure to light. The photosensitive layer of the plates can be developed with a fountain solution in printing machines on site, because the unexposed portion is dissolved in water. The on-press development method has an advantage of having no requirement for installation of a development apparatus and actual operation of development, however, the method has such drawbacks of requiring strict humidity control for the plate as well as contaminating the fountain solution and ink with insoluble components after exposure to light.

As a plate which does not require both wet-development and on-press development, Patent Document 6 (Japanese Patent Laid-open publication No. 1850/1995) discloses a method in which a photosensitive layer contains microcapsules encapsulating an oleophilic substance in a hydrophilic resin which reacts with the hydrophilic groups of the hydrophilic resin and forms chemical bonds, and the microcapsules are collapsed by irradiation with light so as to change the hydrophilic resin into oleophilic. However, this method also has a disadvantage of requiring microcapsules with small diameter to meet the request for higher resolution and lower scumming and also has a difficulty in the production of such microcapsules. While the microcapsules can be collapsed relatively uniformly by heat and pressure on printing with thermal heads, there is such a problem that the microcapsules are collapsed non-uniformly by irradiation with light on printing and also have poor resolution.

The present applicants disclose a plate for lithographic printing in Patent Document 7 (International Publication WO 01/083234), in which the plate is consisted of a photosensitive layer of a hydrophilic resin which is obtained by cross-linking a photosensitive resin composition containing a hydrophilic polymer, a cross-linking agent, and a photo-absorber, or another photosensitive resin composition containing a hydrophilic polymer, across-linking agent, a photo-absorber, and a hydrophobic polymer, and the surface of the plate changes from hydrophilic to inkphilic (having affinity to ink) by irradiation with light. This plate requires no development and wiping off operation and has a good sensitivity and resolution because changes occur only on the surface of the light-irradiated portion. However, an improvement is awaited so as to completely eliminate the ink that adheres on non-image areas.

The same applicants disclose a lithographic printing plate in Patent Document 8 (Japanese Patent Laid-open publication No. 18547/2001), in which the plate has a hydrophilic layer comprising organic substances and has a porous surface. In the plate, an attempt of increasing hydrophilicity of the hydrophilic layer is made by increasing the surface area of the hydrophilic layer through its porous surface and increasing the water-absorbing rate to the plate. However, also in this plate, an improvement is desired so as to completely eliminate the ink that attached to non-image areas. Another improvement is also desired, because the plate does not provide satisfactory performance of imaging when an image is directly printed on the plate by irradiation with laser beam.

Patent Document 1: Japanese Patent Laid-open publication No. 282142/1996
Patent Document 2: Japanese Patent Laid-open publication No. 314934/1995
Patent Document 3: Japanese Patent Laid-open publication No. 109141/2001
Patent Document 4: Japanese Patent Laid-open publication No. 127683/1997
Patent Document 5: Japanese Patent Laid-open publication No. 171249/1997
Patent Document 6: Japanese Patent Laid-open publication No. 1850/1995
Patent Document 7: International Publication WO 01/083234
Patent Document 8: Japanese Patent Laid-open publication No. 18547/2001

DISCLOSURE OF THE INVENTION

Problems to be Solved by the Invention

An anode-oxidized aluminum that is a hydrophilic material is an excellent hydrophilic material for lithographic plates and is widely used. As one of the means for eliminating development process, various kinds of hydrophilic materials for printing plates which is equivalent or superior to the anode-oxidized aluminum in printing performance and can be prepared from low-cost and easy to produce resins have been investigated. However, a hydrophilic layer made from organic compounds as is the case of ink, generally tends to have rather poor hydrophilicity as compared with the anode-oxidized aluminum. That is, even in a hydrophilic layer, which has sufficient wetting performance to water, the adhesion to ink often increases as well because the hydrophilic layer is made from organic compounds. Particularly, an ink once attached to a printing plate is not easy to eliminate. As the result, it was found that cases frequently occurred where an appropriate printed product was not easy to obtain.

Therefore, it is an object of the present invention to provide a lithographic printing original plate with a photosensitive layer which has a photosensitivity to the light in near infrared region, on which images can be printed directly with laser beam, requiring no development and wiping off operation, and immediately recovering from ink stains without any difficulties when an ink attaches to non-image areas on printing, and a lithographic printing plate obtained from the same.

Means for Solving the Problems

In order to achieve the object mentioned above the present inventors have investigated intensively and found that the above-mentioned problems in the production of a lithographic printing original plate having a property that the surface of the photosensitive layer is changed to have affinity for ink by irradiation with light can be solved when recessed parts are formed on the surface of a photosensitive layer by a portion derived from either one of the components that constitute a phase-separation structure on the surface of the photosensitive layer placed on a support when it is subjected to printing. The present invention has been achieved on the basis of the above-mentioned finding and is described as follows:

(1) A lithographic printing original plate having a photosensitive layer formed on a support is characterized in that the surface of the photosensitive layer has a phase-separation structure, and when the lithographic printing original plate is subjected to printing using a fountain solution, a portion derived from either one of the components that constitute the phase-separation structure after printing produces recessed parts on the surface of the photosensitive layer and the surface of the photosensitive layer is changed to have affinity for ink by irradiation with light or thermal energy;

(2) A lithographic printing original plate as described in (1), in which the phase-separation structure is in a sea-island form, there are at least five island portions having a diameter (the diameter means a short axis when the island portion has an elliptic shape with a long axis and a short axis) of 0.5 μm or more to 10 μm or less in an area of 2,500 μm² on any part of the surface of the photosensitive layer, and at least a part of the island portion forms recessed parts on the surface of the plate after the lithographic printing original plate is subjected to printing using a fountain solution;

(3) A lithographic printing original plate as described in (2), wherein the mean value of the short axis of the island portion is 0.5 μm or more to 10 μm or less;

(4) A lithographic printing original plate as described in (1), wherein the photosensitive layer contains hydrophilic resins comprising a hydrophilic resin that is obtained by reacting at least a N-alkyl or N-alkylene substituted (meth) acrylamide type compound represented by following general formula (1) and/or (2);

[formula 1]

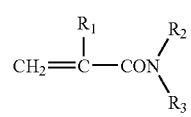

(1)

In the above formula, $R_1$ represents a hydrogen atom or a methyl group; $R_2$ and $R_3$ represent a hydrogen atom or a lower alkyl or a lower alkoxy group.

[formula 2]

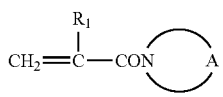
(2)

In the above formula, $R_1$ represents a hydrogen atom or a methyl group; A represents $(CH_2)_n$, wherein n represents an integer of 4 to 6, or $(CH_2)_2O(CH_2)_2$.

(5) A lithographic printing original plate as described in (4), wherein the hydrophilic resin is obtained by reacting further one or more kinds of compounds selected from the compounds having the following general formula (3) and/or salts thereof;

[formula 3]

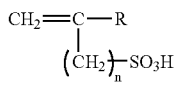
(3)

In the above formula, R represents a hydrogen atom or a lower alkyl group; n represents an integer of 1 to 8.

(6) A lithographic printing original plate as described in (1), wherein the photosensitive layer is obtained by cross-linking a photosensitive resin composition comprising a hydrophilic resin having cross-linking groups capable of reacting with at least a cross-linking agent, a cross-linking agent, and a photothermal conversion material;

(7) A lithographic printing original plate as described in (1), wherein the photosensitive layer is obtained by cross-linking a photosensitive resin composition containing a hydrophilic resin having cross-linking groups capable of reacting with at least a cross-linking agent, a cross-linking agent, organic fine particles, and a photothermal conversion material;

(8) A lithographic printing plate that is obtained by irradiation with light or thermal energy to the lithographic printing original plate as described in (1);

(9) A photosensitive resin composition containing a hydrophilic resin obtained by reacting a N-alkyl or N-alkylene substituted (meth) acrylamide compound represented by following general formula (1) and/or (2), a hydrophilic resin having cross-linking groups that can react at least with a cross-linking agent, a cross-linking agent, and a photothermal conversion material; and

[formula 4]

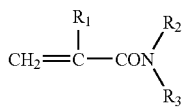
(1)

In the above formula, $R_1$ represents a hydrogen atom or a methyl group; $R_2$ and $R_3$ represent a hydrogen atom or a lower alkyl or alkoxy group.

[formula 5]

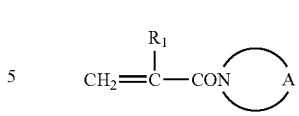
(2)

In the above formula, $R_1$ represents a hydrogen atom or a methyl group; A represents $(CH_2)_n$, wherein n represents an integer of 4 to 6, or $(CH_2)_2O(CH_2)_2$.

(10) A photosensitive resin composition as described in (9), which further contains organic fine particles.

EFFECT OF THE INVENTION

A lithographic printing original plate according to the present invention provides a printing plate which requires no development and wiping off operation and immediately eliminates ink stains even when an ink attaches to non-image areas on printing.

BEST MODE FOR CARRYING OUT THE INVENTION

Hereinafter, a lithographic printing original plate according to the present invention, a lithographic printing plate obtained therefrom, and a method of producing the printing plate are described in detail.

A lithographic printing original plate according to the present invention has such a property that the surface of a photosensitive layer is changed to have affinity for ink by irradiation with light or thermal energy. The portion of the photosensitive layer irradiated with light or thermal energy is not eliminated by abrasion. Therefore, a printing plate of the present invention requires no development and wiping off operation after irradiation with light.

A lithographic printing original plate provided by the present invention is a lithographic printing original plate having such a property that the surface of a photosensitive layer is changed to have affinity for ink by irradiation with light or thermal energy. The lithographic printing original plate is characterized in that the surface of the photosensitive layer of the lithographic printing original plate having a photosensitive layer formed on a support produces a phase-separation structure, and that when the lithographic printing original plate is subjected to printing using a fountain solution, a portion derived from either one of the components that constitute the phase-separation structure after printing produces recessed parts on the surface of the photosensitive layer. As long as the conditions are satisfied, any lithographic printing original plate belongs to the present invention regardless of kinds or compositions of photosensitive layers.

The phase-separation state on the surface of the plate can be observed with an optical microscope or a scanning electron microscope. The formation of recessed parts on the plate after printing can be identified by observing the change of the state of the plate before and after printing using the above-mentioned method. Further, through surface-roughness measurement with a help of a noncontact surface-roughness meter or an atomic force microscope (AFM) and the like, the change in the sate of the plate before and after printing can be identified. The effect of the present invention can be attained by the production of recessed parts so long as the change is identified by the above-mentioned method. Even in the case where the plate is not subjected to printing, the change in the surface of the plate can be quasi-identified by observing the surface of the plate after the plate is immersed in water and dried naturally. In the present invention, the recessed parts are formed on the surface of a photosensitive layer by the dissolution of one component of photosensitive layer constituting the phase-separation, which is soluble in water or a fountain solution. The depth of the recessed parts depends on the state of phase-separation and cannot be described clearly, but the depth is preferably 50 nm or more. The component which is dissolved out in water or a fountain solution can be identified by GPC or NMR analysis after the solution dissolving the component is concentrated in an appropriate concentration.

As mentioned above, because the component, which can form recessed parts after printing and can dissolve out in water or a fountain solution exists in the phase-separation structure, it is considered that the component is dissolved out efficiently in water or a fountain solution on printing, providing a good hydrophilicity, playing a role in leaching out ink attached particularly to non-image portion. It is also considered that the portion remained after the component is dissolved out in water or a fountain solution forms voids, contributing to enhance water retention. Further, because the component possesses a molecular mobility with higher freedom, it is considered that the component provides an enhanced retention of water or a fountain solution, resulting in a printing plate with favorable performance of having a surface not easy to dry.

In order to develop the above-mentioned performance effectively, the phase-separation structure of the plate surface is preferably a sea-island structure, and more preferably the island portion forms recessed parts after printing. In the sea-island phase-separation structure, there are preferably at least five, more preferably at least twenty island portions having a diameter (the diameter means the short axis when the island portion has an elliptic shape with a long axis and a short axis) of 0.5 μm or more to 10 μm or less in an area of 2,500 μm$^2$ on any surface of the photosensitive layer. As long as the number of the island portion is in the above range, the surface of a photosensitive layer of the present invention has a good hydrophilicity for developing the function of leaching out ink attached particularly to non-image areas. The number and diameter of the island portion can be regulated by controlling the phase-separation structure in the photosensitive layer on the surface of a plate, more specifically, by controlling the ratios and kinds of raw materials used for various photosensitive layers, including a hydrophilic resin described below. When a photosensitive layer is prepared by coating and drying a photosensitive solution, further through cross-linking, the number and diameter of the island portion can be also regulated to some extent by drying time and temperature required for removing solvent from the photosensitive solution, while this depends on compositions and is not always the case.

The mean value of diameter of the island portion is preferably 0.5 μm or more to 10 μm or less, further preferably 0.5 μm or more to 5 μm or less, more preferably 1 μm or more to 4 μm or less, still more preferably 1 μm or more to 3 μm or less. Herein, the diameter of the island portion means a short axis when the island portion has an elliptic shape with a long axis and a short axis. The mean value of diameter can be obtained by analyzing with an image analyzer the surface image of a plate observed by optical microscope or scanning electron microscope. The diameter (short axis) means a minimum diameter among the ones that are obtained by connecting the two points on the periphery of the island with a line passing through the gravity point of the island. The diameter (long axis) means a maximum diameter among the ones that are obtained by connecting the two points on the periphery of an island with a line passing through the gravity point of the island. The mean value of diameter is a mean value of diameters of each island portions obtained by analyzing the area of at least 2,500 μm$^2$ on any surface of a photosensitive layer. As long as the mean value of diameters of the island portions is in the above-mentioned range, the surface of a photosensitive layer of the present invention provides a good hydrophilicity for developing an excellent function of leaching out ink attached particularly to non-image areas. Also, it can develop a good ink receiving performance at the image areas. Further, in order to develop the function of leaching out ink attached to non-image areas and also develop a good ink-receiving performance on image areas, the mean value of long axis (diameter) of the island portion is also preferably 0.5 μm or more to 10 μm or less, more preferably 0.5 μm or more to 6.5 μm or less, still more preferably 1 μm or more to 6 μm or less, still more preferably 1 μm or more to 5 μm or less.

In order that the plate forms a phase-separation structure and that the one component constituting the phase-separation structure produces recessed parts after printing, the components of a photosensitive layer in the plate preferably contain a hydrophilic resin. The hydrophilic resin is a resin which has a hydrophilic group such as hydroxyl, amide, sulfonamide, oxymethylene, oxyethylene group and the like, and further an acidic group such as carboxyl, sulfonic acid or phosphonic acid group, or an alkali metal or amine salt of the acidic group, and has solubility in water. The solubility in water is specifically preferably 20% by mass, more preferably at least 50% by mass, still more preferably at least 80% by mass at 25° C.

In the present invention, a photosensitive resin composition, which forms a photosensitive layer on a support in a manner that the photosensitive layer has the performance described above, contains preferably a hydrophilic resin, preferably two or more kinds of hydrophilic resins. Further, these hydrophilic resins preferably contain two kinds of resins, that is a hydrophilic resin having cross-linking groups that can react at least with a cross-linking agent (hereinafter may be referred to as hydrophilic resin for cross-linking to be explained later) and another hydrophilic resin having no functional groups that can react with a cross-linking agent (hereinafter may be referred to as hydrophilic resin for non-cross-linking). In order to obtain good hydrophilicity and durability of plates and to keep a persistent effect in dissolution of the components of the hydrophilic resin for non-cross-linking on printing, the hydrophilic resin for non-cross-linking has a Brookfield viscosity of 10,000 cps or less at 25° C. as a 10% by mass aqueous solution, more preferably 5,000 cps or less, still more preferably 1,000 cps or less. The weight average molecular weight (Mw) is preferably 1,000 or more, more preferably 3,000 or more, still more preferably 10,000 or more.

More specific examples of the hydrophilic resin for non-cross-linking which can be used in the present invention are listed saponificated polyvinylacetates, celluloses, gelatin, or a resin or its hydrolyzed form which is obtained by polymerizing or copolymerizing unsaturated monomers having above-described hydrophilic groups, N-vinylacetoamide, N-vinylformamide, vinylacetate, vinylether and the like.

The hydrophilic resin for non-cross-linking used in the present invention preferably involves at least a hydrophilic resin which is obtained through a reaction using N-alkyl or N-alkylene substituted (meth)acrylamide, including (meth)acrylamide, represented by the following general formulas (1) and/or (2).

[formula 6]

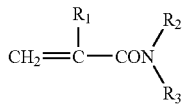

(1)

In the above formula, $R_1$ represents a hydrogen atom or a methyl group; $R_2$ and $R_3$ represent a hydrogen atom or a lower alkyl or a lower alkoxy group.

[formula 7]

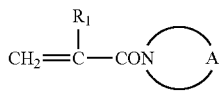

(2)

In the above formula, $R_1$ represents a hydrogen atom or a methyl group; A represents $(CH_2)_n$, wherein n represents an integer of 4 to 6, or $(CH_2)_2O(CH_2)_2$.

In the general formulas (1) and (2), the specific examples of the lower alkyl groups include methyl, ethyl, propyl, butyl group and the like, and the specific examples of the lower alkoxy groups include methoxy, ethoxy, propoxy group and the like. More preferably, $R_2$ in the above-described compound (1) represented by formula (1) is a methyl or an ethyl group, and $R_3$ is a hydrogen atom, methyl, ethyl or propyl group.

The specific examples of N-alkyl or N-alkylene substituted (meth)acrylamides represented by compounds (1) and/or (2) include (meth)acrylamide, N-methyl(meth)acrylamide, N-ethyl(meth)acrylamide, N,N-dimethyl(meth)acrylamide, N,N-diethyl(meth)acrylamide, N-methyl-N-ethyl(meth)acrylamide, N-isopropyl(meth)acrylamide, N-n-propyl(meth)acrylamide, N-(meth)acryloylpyrrolidine, N-(meth)acryloylpiperidine, N-acryloylhexahydroazepine, N-acryloylmorpholine, methoxymethyl(meth)acrylamide, butoxymethyl(meth)acrylamide and the like. In the description of the present invention, (meth)acrylamide and the like means both acrylamide and methacrylamide. A hydrophilic resin which is obtained by polymerization using acrylamide as a monomer among these monomers is more preferable. Two or more kinds of the above compounds can be used as well. The compounds (1) and/or (2) are used as a monomer for a hydrophilic resin for non-cross-linking in an used amount of preferably 60% or more by mass in the hydrophilic resin for non-cross-linking, more preferably 60 to 99.9% by mass, still more preferably 60 to 99% by mass. By using the compounds described above, a lithographic printing original plate according to the present invention provides a good hydrophilicity.

The hydrophilic resin for non-cross-linking is preferably prepared by further using as a monomer one or more kinds of compounds selected from a compound represented by the following formula (3) and/or salts thereof. The monomer is used in an amount of preferably 0.01 to 10% by mass with respect to the total used amount in the hydrophilic resin for non-cross-linking, more preferably 0.1 to 5% by mass, still more preferably 0.2 to 3% by mass.

[formula 8]

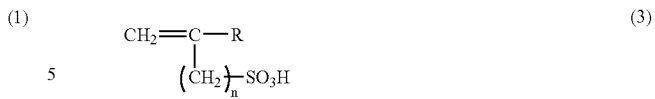

(3)

In the above formula, R represents a hydrogen atom or a lower alkyl group; n represents an integer of 1 to 8.

By using the compound described by above general formula (3), hydrophilicity of the hydrophilic resin for non-cross-linking is further improved.

In the general formula (3), R represents a hydrogen atom or a lower alkyl group. The lower alkyl group is preferably an alkyl group having 1 to 3 carbon atoms, specifically methyl, ethyl, n-propyl or i-propyl group, and n represents an integer of 1 to 8, preferably n=1.

The specific examples of compounds represented by the general formula (3) include allylsulfonic acid, sodium allylsulfonate, potassium allylsulfonate, methallylsulfonic acid, sodium metallylsulfonate, potassium metallylsulfonate, ammonium metallylsulfonate and the like. Particularly, metallylsulfonic acid, sodium metallylsulfonate or potassium metallylsulfonate is preferable.

As the other compositions for the hydrophilic resin for non-cross-linking, various kinds of monomers as well as the monomers which will be described in the following section of a hydrophilic resin for cross-linking can be used, so long as the hydrophilicity is not damaged. A particularly preferable functional groups include carboxyl group, its salts, sulfonic acid group and its salts so as to enhance hydrophilicity. In this regard, however, it is preferable that the hydrophilic resin for non-cross-linking has a composition that does not react with a cross-linking agent described below, or that has a definite difference in the reactivity as compared with that of the hydrophilic resin for cross-linking and a cross-linking agent described below.

A hydrophilic resin contained in a photosensitive resin composition in the present invention preferably has at least two kinds of resins including a hydrophilic resin for cross-linking which has functional groups reacting with a cross-linking agent and a hydrophilic resin for non-cross-linking which is described above and has a capability of dissolving out in water. As mentioned above, the hydrophilic resin for non-cross-linking has no functional groups reacting with a cross-linking agent and has a capability of dissolving out when a plate is immersed in water or fountain solution after the printing plate is produced. By cross-linking the hydrophilic resin for cross-linking, a photosensitive layer formed on a support can be subjected to printing without damaging its shape on printing, on the other hand, the hydrophilic resin for non-cross-linking capable of being released is considered to play a role of eliminating ink attached to non-image areas in the cured photosensitive layer. When organic fine particles are involved in the photosensitive composition, the organic fine particles are foamed or thermally fused on irradiation with light or thermal energy, so that the portion on the surface of the photosensitive layer to which light or thermal energy is irradiated is considered to lose hydrophilicity and to change to have affinity for ink. In order that the change to have affinity for ink is carried out efficiently by the above-described thermal change of the organic fine particles, it is preferred that a photothermal conversion material be contained in the photosensitive layer.

A photosensitive resin composition according to the present invention is further described below. A hydrophilic resin for cross-linking which is contained in the photosensitive composition preferably has hydrophilic groups and functional groups (cross-linking functional groups) capable of reacting with a cross-linking agent. The hydrophilic resin for cross-linking can be obtained by copolymerization using two or more kinds of monomers (cross-linking monomers) which have the hydrophilic groups and cross-linking functional groups, as appropriate.

The cross-linking functional groups react with a cross-linking agent, playing a role to cure the hydrophilic resin, so that the cross-linking functional groups are required to provide a sufficient curing effect within a range where the hydrophilicity of the hydrophilic resin is not impaired. To this end, the hydrophilic resin described above is preferably obtained by polymerizing a monomer that contains the cross-linking monomer in an amount of 0.1 to 40% by mass, more preferably 1 to 40% by mass, still more preferably 3 to 30% by mass.

Examples of the cross-linking functional groups include hydroxyl, amide, amino, isocyanate, glycidyl, oxazoline, methylol, methoxymethyl, butoxymethyl group and the like which are obtained by condensation of a methylol group with alcohol such as methanol or butanol. Further, examples thereof include acidic groups including carboxyl, sulfonic acid, phosphonic acid group and the like, and an alkali metal or amine salt of the acidic groups and the like. In accordance with the selection of a cross-linking agent, the cross-linking functional group can be selected, however, hydroxyl group is more preferable as the functional group because cross-linking reaction can be made by hydroxyl group without damaging hydrophilicity.

Examples of monomers having hydroxyl group include hydroxyethyl(meth)acrylate, polyethyleneglycolmono(meth)acrylate, hydroxypropyl(meth)acrylate, polypropyleneglycolmono(meth)acrylate, hydroxybutyl(meth)acrylate, and methylol(meth)acrylamide. Particularly, hydroxyethyl(meth)acrylate or methylol(meth)acrylamide is preferred.

As mentioned above, it is preferred that the hydrophilic resin for non-cross-linking have such a composition that the hydrophilic resin does not react with a cross-linking agent and provides a definite difference in reactivity as compared with the reactivity between the hydrophilic resin for cross-linking and a cross-linking agent. From this point of view, the hydrophilic resin for non-cross-linking contains the above-mentioned monomers having hydroxyl group in an amount of preferably 5% or less by mass, more preferably 2% or less by mass, still more preferably 0.5% or less by mass.

In order to obtain such a good phase-separation structure as defined in the present invention, the composition of the hydrophilic resin for cross-linking is preferably similar to the composition of the hydrophilic resin for non-cross-linking described above. Specifically, when the hydrophilic resin for non-cross-linking that is prepared by reacting the compounds represented by the above-mentioned general formulas (1) and/or (2) is used, the hydrophilic resin for cross-linking is similarly preferably prepared from a reaction using N-alkyl or N-alkylene substituted (meth)acrylamide, including (meth)acrylamide, represented by the following general formulas (1) and/or (2).

[formula 9]

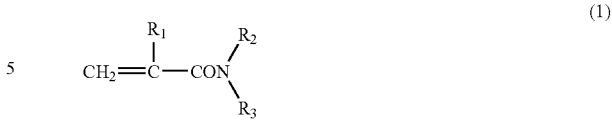

In the above formula, $R_1$ represents a hydrogen atom or a methyl group; $R_2$ and $R_3$ represent a hydrogen atom or a lower alkyl or alkoxy group.

[formula 10]

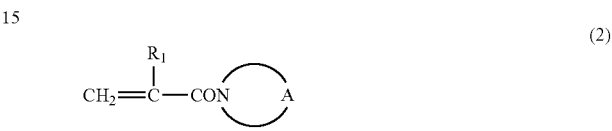

In the above formula, $R_1$ represents a hydrogen atom or a methyl group; A represents $(CH_2)_n$, wherein n represent an integer of 4 to 6, or $(CH_2)_2O(CH_2)_2$.

In the general formulas (1) and (2), specific examples of the lower alkyl groups include methyl, ethyl, propyl, butyl group and the like, and specific examples of the lower alkoxy groups include methoxy, ethoxy, propoxy group and the like. More preferably, $R_2$ in the above-described compound (1) is a methyl or an ethyl group, and $R_3$ is a hydrogen atom, methyl, ethyl or propyl group.

The specific examples of the monomers are the same as described in the section of the above-mentioned hydrophilic resin for non-cross-linking, but a hydrophilic resin which is obtained by polymerization using acrylamide as a monomer among these monomers is more preferable.

Two or more kinds of the above compounds can be used as well.

The compounds (1) and (2) are used in the hydrophilic resin for cross-linking in an amount of preferably 60% or more, more preferably 60 to 99.9% by mass, still more preferably 60 to 99% by mass. By using the compounds described above, a lithographic printing original plate according to the present invention exhibits a good hydrophilicity as the result of the improvement in hydrophilicity of the hydrophilic resin for cross-linking.

The hydrophilic resin for cross-linking has a Brookfield viscosity of 50,000 cps or less at 25° C. for a 7% by mass aqueous solution, more preferably 10,000 cps or less. Within this viscosity range, the hydrophilic resin for cross-linking provides a good workability when it is mixed with materials other than hydrophilic resins. Further, a good workability is obtained when the photosensitive resin composition is coated on a substrate, and uneven coating is prevented. The Brookfield viscosity in the present invention is obtained by measuring viscosity using commercially available Brookfield viscometer (available from Brookfield Engineering Laboratories, Inc.) or B type viscometer (available from TOKI SANGYO CO., LTD.) after a 7% by mass sample water solution was kept at 25° C.

The hydrophilic resin for cross-linking used for a photosensitive resin composition has a weight average molecular weight (Mw) of preferably 200,000 or more, more preferably 300,000 or more. By using such a hydrophilic resin for cross-linking having a molecular weight of the above-described value, a lithographic printing plate according to the present invention exhibits a higher printing resistance without lowering hydrophilicity of the plate. The molecular weight can be obtained by the measurement of gel permeation chromatography (GPC) and the like.

For the hydrophilic resins (including both hydrophilic resin for cross-linking and hydrophilic resin for non-cross-linking), various kinds of monomers other than the above-mentioned monomers can be used so long as hydrophilicity of the resins is not impaired. Examples of these monomers are specifically listed below, but these monomers sometimes work as a monomer which will participates in cross-linking reaction depending on the kind of cross-linking agents described below. So that attention should be paid when these monomers are particularly used for the hydrophilic resin for non-cross-linking.

Examples of monomers having an amide group, other than N-substituted (meth)acrylamide derivatives including (meth)acrylamide shown in the above mentioned (1) and (2), include non-substituted or substituted itaconic acid amide, non-substituted or substituted fumaric acid amide, non-substituted or substituted phthalic acid amide, N-vinylacetoamide, N-vinylformamide, diacetone (meth)acrylamide, sulfonic acid propyl(meth)acrylamide, methoxymethyl(meth)acrylamide, butoxymethyl(meth)acrylamide and the like. In the case of di-basic acid amide such as the above-described itaconic acid amide, a mono-amide in which one carboxyl groups is amidated or a di-amide in which both of carboxyl groups are amidated can be also used.

Examples of monomers having a glycidyl group include glycidyl(meth)acrylate and paravinylphenylglycidylether. Examples of monomers having a carboxyl group include mono-basic unsaturated acid such as (meth)acrylic acid, di-basic unsaturated acid such as itaconic acid, fumaric acid, maleic acid and its anhydride, monoesters of the di-basic unsaturated acid and monoamides of the di-basic unsaturated acid. Examples of monomers having sulfonic acid group include sulfoethyl(meth)acrylate, (meth)acrylamidemethylpropane sulfonic acid, vinylsulfonic acid, vinylmethylsulfonic acid, isopropenylmethylsulfonic acid, sulfuric acid ester of alcohol obtained by adding ethylene oxide or propylene oxide to (meth) acrylic acid (for example, ELEMINOL RS-30™, available from SANYO CHEMICAL INDUSTRIES, LTD.), (meth)acryloyloxyethylsulfonic acid, an ester of monoalkylsulfosuccinic acid ester and a compound having an allyl group, and are action product of monoalkylsulfosuccinic acid ester and glycidyl(meth)acrylate. Examples of polymerizable unsaturated monomers having a phosphonic acid group include vinylphosphoric acid, phosphoric acid mono(2-hydroxyethyl)(meth)acrylate, and mono(2-hydroxyethyl) (meth)acrylate of phosphoric acid monoalkylester.

The carboxyl group or sulfonic acid group can be optionally neutralized with alkali metal, alkaline earth metal, or amines. Examples of alkali metals used for neutralization include sodium, potassium, and lithium. Examples of alkaline earth metals include calcium, magnesium and the like. Examples of amines include ammonia, methylamine, dimethylamine, trimethylamine, ethylamine, diethylamine, triethylamine, monoethanolamine, diethanolamine, triethanolamine and the like.

For polymerization, monomers copolymerizable with the above-described monomers can be used optionally in combination as necessary. The copolymerizable monomers include, for example, methyl(meth)acrylate, ethyl(meth)acrylate, butyl(meth)acrylate, 2-ethylhexyl(meth)acrylate, dimethylaminoethyl(meth)acrylate, diethylaminoethyl(meth)acrylate, phenoxyethyl(meth)acrylate, benzyl(meth)acrylate, isoboronyl(meth)acrylate, adamantyl(meth)acrylate, cyclohexyl(meth)acrylate, styrene, α-methylstyrene, acrylonitrile, methacrylonitrile, vinylacetate and the like.

A multi-functional monomer having two or more double bonds can be optionally used. Specific examples of the multi-functional monomers include methylene bisacrylamide, ethylene bisacrylamide, ethylene bis(meth)acrylamide, ethyleneglycol diacrylate, ethyleneglycol dimethacrylate, diethyleneglycol acrylate, diethyleneglycol methacrylate, divinylbenzene, diallylacrylamide, triallylisocyanurate, triacrylic acid pentaerythritol and the like. The amount of the multi-functional monomer is preferably 0.005 to 5% by mass with respect to all of the monomers consisting of the hydrophilic resin, more preferably 0.01 to 2% by mass.

The photosensitive resin composition which becomes the photosensitive layer of the lithographic printing original plate of the present invention is preferred to be made insoluble in water by cross-linking of the water soluble resin for cross-linking in order to obtain good printing resistance. Thus it is preferred to use a cross-linking agent which can make cross-linking reaction with the water soluble resin for cross-linking. The cross-linking agent which is contained in the photosensitive resin composition which forms a photosensitive layer of the lithographic printing original plate of the present invention is specifically at least one kind selected from water-based epoxy resin, oxazoline resin, amino resin, water-based blocked-isocyanate compounds and the like. In order to accelerate cross-linking reaction, may be used in combination tert-amines when the aforementioned epoxy resin is used, or when an amino resin is used an acidic compound such as paratoluene sulfonic acid, alkylbenzene sulfonic acid or ammonium chloride.

At least one kind of the above described resins is preferably used as a cross-linking agent in view of such balances between curing rate and stability at room temperature of the photosensitive resin composition or between hydrophilicity and printing resistance of the photosensitive layer. Among them, amino resin is preferably used. Further, examples of the amino resin include melamine resin, urea resin, benzoguanamine resin, glycoluril resin and the like, and a denatured resin of these resins such as carboxy-denatured melamine resin and the like. Among them, melamine resin is preferred, because melamine resin can provide a good balance between hydrophilicity and printing resistance. Examples of the melamine resins include methylated melamine resin, butylated melamine resin and the like, and include methylol group type melamine resin, imino group type melamine resin, methylol and imino group type melamine resin which have a methylol group, imino group or the like, so-called fully alkylated melamine resin which has no methylol and imino groups and the like.

The main role of the above-described cross-linking agent is to cross-link the above-described hydrophilic resin for cross-linking and to make the hydrophilic resin for cross-linking insoluble in water. In addition, when a cross-linking agent possesses a self-polymerization character, the cross-linking agent forms an island phase in the hydrophilic resin in a photosensitive layer, so that the main role also includes the function that the hydrophilic surface of a light-irradiated portion is changed to have affinity for ink by foaming the island phase with heat which is generated when a photothermal conversion material contained in the photosensitive layer absorbs light and converts light energy into thermal energy.

In the present invention, organic fine particles are preferably further used in a photosensitive resin composition so that the hydrophilic surface of a light-irradiated portion is facilitated to change to have affinity for ink by irradiation with light or thermal energy. The organic fine particles mean water-dispersing organic fine particles which can disperse in water as fine particles by optionally adding an additive such as surfactant or by polar structure of the resin itself. The organic fine particles can optionally have a protective material which coats the organic fine particles.

Examples of methods of preparing the organic fine particles include a method in which unsaturated monomers are polymerized in water with or without emulsifier or dispersant, more specifically a method in which unsaturated monomers are subjected to emulsion polymerization, soap-free emulsion polymerization, precipitation polymerization, dispersion polymerization or suspension polymerization, a method in which hydrophilic components are directly introduced into the framework of a resin by using a hydrophilized material so as to obtain organic fine particles of self-emulsifying type or of ionomer type, a method in which a resin is mechanically forced to be emulsified, optionally by adding a dispersing auxiliary agent or a surfactant, a method of so-called dissolution suspension polymerization in which a resin is preliminary dissolved in an organic solvent, then dispersed in water, and a method using above methods in combination as appropriate. Organic fine particles prepared in any method can be used.

The organic fine particles include more specifically such as water-dispersing vinyl polymer, conjugated diene polymer latex, acrylic type emulsion, water-dispersing type polyurethane resin, water-dispersing type polyester resin, water-dispersing epoxy resin type, and further include a mixture of these water-dispersing type polymer (resin) or composite particles which are obtained by preparing different kinds of polymer components, for example, by emulsion polymerization in the presence of these water-dispersing type polymer particles.

The role of the above-described organic fine particles can be assumed to change the hydrophilicity of the surface of a light-irradiated portion into a surface having affinity for ink by thermal melting and welding of the organic fine particles with heat that is generated when a photothermal conversion material contained in a photosensitive layer absorbs light and converts light energy into thermal energy. In order to make efficiently the change into a surface having affinity for ink by thermal melting and welding, the mean particle diameter of the organic fine particles is preferably 0.005 to 0.5 µm, more preferably 0.01 to 0.2 µm. Within this range of mean particle diameter, the organic fine particles are easy to melt and weld by the generated heat and have a higher sensitivity, hardly reducing hydrophilicity of the non-image areas of a photosensitive layer. The mean particle diameter is a weight average particle diameter which can be determined with the dynamic scattering method and the like. For example, the mean particle diameter can be measured with LPA3100 and the like available from OTSUKA ELECTRONICS CO., LTD. The organic fine particles exist in a photosensitive layer while keeping their shape. That is, the photosensitive layer acquires a phase-separation structure which is derived from the existence of the organic fine particles and has the same size with the particle size of the organic fine particles of 0.005 to 0.5 µm. Together with the above-described phase-separation structure that produces recessed parts after printing, the photosensitive layer preferably has two phase-separation structures.

In image areas, the photosensitive layer of the present invention forms a phase-separation structure that produces recessed parts after printing. In order to develop good affinity for ink while keeping the structure, the water-dispersing organic fine particles are preferably acrylic type emulsion, water-dispersing polyurethane resin, water-dispersing polyester resin, or water-dispersing epoxy resin, further preferably is used water-dispersing polyurethane resin or water-dispersing polyester resin. Among there resins, particularly water-dispersing polyurethane resin, water-dispersing polyester resin, or water-dispersing epoxy resin which has a ring-structure in its principal chain framework is preferable, because a resin having a ring structure such as aromatic ring in its principal chain framework particularly provides a good balance between ink-receiving performance and hydrophilicity.

These organic fine particles preferably possesses an acid value so as to have stable water-dispersability and to develop good hydrophilicity in non-image areas. A preferable range of the acid value in terms of a solid content of each resin is 80 KOHmg/g or less, more preferably 70 KOHmg/g or less, still more preferably 3 to 70 KOHmg/g. The acid value of the organic fine particles is an amount of potassium hydroxide in mg required to neutralize 1 g of the organic fine particles. The acid value is determined by publicly known neutralization titration, in which a solvent having an excellent solubility to organic fine particles is preferably used, specifically dimethylformamide or N-methylpyrrolidone is preferred. The endpoint of the titration can be detected with an indicator such as phenolphthalein or by potentiometric titration.

A photosensitive resin composition of the present invention preferably contains a photothermal conversion material when images are formed by exposing to laser beam, visible light, or UV light. The photothermal conversion material generates heat by absorbing light, so that is used a light having a wavelength region at which the light can be absorbed in the photothermal conversion material as appropriate. The specific example of the photothermal conversion material includes various kinds of dyes such as cyanine dye, polymethine dye, phthalocyanine dye, naphthalocyanine dye, anthracyanine dye, porphyrin dye, azo dye, benzoquinone dye, naphthoquinone dye, dithiol metal complexes, diamine metal complexes, nigrosin and the like, or carbon black.

Among these dyes, a dye absorbing light in the range of 750 to 1100 nm is preferable from the standpoint of handling under the light, lighting source power of exposure system, or easiness for handling. More specifically, a dye having a maximum absorbing wavelength ($\lambda_{max}$) of 750 to 900 nm is preferable. The wavelength region of the light absorbed by a dye can be changed by substitution groups or the length of π-electron conjugated system. In order to obtain effective photothermal conversion, absorption coefficient of εmax at the maximum absorption wavelength is preferably $1\times10^5$ Lmol$^{-1}$cm$^{-1}$ or more, more preferably $2\times10^5$ Lmol$^{-1}$cm$^{-1}$. The photothermal conversion material may be dissolved or dispersed in an aqueous solution that contains photosensitive resin compositions, but in the present invention among the above-described photothermal conversion materials, a hydrophilic photothermal conversion material is preferable so that the photothermal conversion material are contained in the photosensitive layer and impart sufficient hydrophilicity to the plates. Specifically, a photothermal conversion material having at least 1% by mass of solubility in water is preferable.

To a photosensitive resin composition of the present invention, various kinds of surfactants can be optionally added in order to ensure a wider window of stability depending on printing conditions. Examples of the surfactants include anionic surfactants, cationic surfactants, nonionic surfactants, amphoteric surfactants and the like. Further, in order to obtain improved coatability of an aqueous solution of a photosensitive resin composition, can be optionally admixed an additive such as an anti-repelling agent or a leveling agent. The amount of the surfactants is preferably 0.001 to 5 parts by weight with respect to 100 parts by weight of the total amounts of a hydrophilic resin, a cross-linking agent, and organic fine particles.

A photosensitive layer of the present invention is obtained by cross-linking the above-described photosensitive resin composition. So long as the ratio of composition in the photosensitive resin composition are in the following range, a good printing plate can be provided. The mixing amount of a hydrophilic resin for cross-linking in the photosensitive resin composition is preferably 10 parts or more by weight with respect to 100 parts by weight of the total amounts of the hydrophilic resins (hydrophilic resin for cross-linking and hydrophilic resin for non-cross-linking), the cross-linking agent, organic fine particles, and the photothermal conversion material, more preferably 10 parts or more by weight and 60 parts or less by weight.

The mixing amount of a hydrophilic resin for non-cross-linking contained in a photosensitive resin composition of the present invention is preferably 0.1 parts by weight or more to 50 parts by weight or less with respect to 100 parts by weight of the total amounts of hydrophilic resins (a hydrophilic resin for cross-linking and a hydrophilic resin for non-cross-linking), across-linking agent, organic fine particles, and a photothermal conversion material, more preferably 1 part by weight or more to 30 parts by weight or less, still more preferably 2 parts by weight or more to 20 parts by weight or less. In addition, with respect to 100 parts by weight of the total amounts of a hydrophilic resin for cross-linking and a hydrophilic resin for non-cross-linking, the amount of the hydrophilic resin for non-cross-linking is preferably 1 to 70 parts by weight, more preferably 5 to 50 parts by weight.

The amount of the cross-linking agent in a photosensitive resin composition of the present invention is preferably 3 to 60 parts by weight with respect to 100 parts by weight of the total amounts of hydrophilic resins, a cross-linking agent, organic fine particles, and a photothermal conversion material, more preferably 5 to 50 parts by weight. So long as the amount of the cross-linking agent is in the above range, a lithographic printing plate of the present invention exhibits a good hydrophilicity and a higher printing resistance.

The amount of organic fine particles contained in a photosensitive resin composition is the more is better in view of improving affinity for ink of a light-irradiated portion. However, too much organic fine particles are unfavorable because they cause decreased hydrophilicity of the plates, producing scumming on printing. It is also unfavorable that when the amount of organic fine particles gets smaller, the ink-receiving performance of the plates becomes lowered. From such a viewpoint, the amount of organic fine particles contained in a photosensitive resin composition of the present invention is preferably as a solid content 10 to 80 parts by weight with respect to 100 parts by weight of the total amounts of hydrophilic resins (a hydrophilic resin for cross-linking and a hydrophilic resin for non-cross-linking), across-linking agent, organic fine particles, and a photothermal conversion material, more preferably 15 to 70 parts by weight. Too much photothermal conversion material adversely affect the printing resistance and hydrophilicity of the plates, on the other hand, too less the light absorber is also unfavorable, because the effect of the photothermal conversion material becomes small. From such a viewpoint, the mixing ratio of photothermal conversion material in a photosensitive resin composition of the present invention is preferably 2 to 40 parts by weight with respect to 100 parts by weight of the total amounts of hydrophilic resins (including a hydrophilic resin for cross-linking and a hydrophilic resin for non-cross-linking), across-linking agent, organic fine particles, and a photothermal conversion material, more preferably 2 to 30 parts by weight.

In a lithographic printing original plate of the present invention, a photosensitive layer is formed directly or through the other layer on a substrate. Specific examples of the substrates include a metal plate such as aluminum plate, steel plate, stainless steel plate, copperplate and the like, a plastics film such as polyester, nylon, polyethylene, polypropylene, polycarbonate, ABS resin and the like, paper, aluminum laminated paper, metal deposited paper, plastics film laminated paper and the like. The thickness of these materials is generally 100 to 400 µm, but there is no limitation to the thickness. In order to improve adhesion of these materials, the material can be subjected to surface treatment such as oxidation treatment, chromate treatment, sandblast treatment, or corona discharging treatment. Further, a primer layer can be interposed between the substrate and photosensitive layer in order to enhance adhesion between the substrate and photosensitive layer. As the primer layer, it is preferable to use the above-described organic fine particles.

A photosensitive layer of the present invention is prepared by drying and curing of the substrate coated with a solution of a photosensitive resin composition which contains hydrophilic resins, a cross-linking agent, organic fine particles, and a photothermal conversion material. The method of coating depends on viscosity of a solution to be coated or coating rate, but generally can be applied the method of roll coater, blade coater, gravure coater, curtain flow coater, die coater, spraying and the like. After a coating solution is coated, the resultant coating layer is dried and the hydrophilic resins are cross-linked by heating. The heating temperature is generally approximately 50 to 200° C. The thickness of the photosensitive layer is generally 0.5 to 10 µm, but there is no limitation to the thickness.

In a lithographic printing original plate of the present invention, after a photosensitive layer of hydrophilic resins is formed, calendaring can be applied or a film can be laminated on the photosensitive layer so as to protect it.

In a lithographic printing original plate of the present invention, by irradiation of a light having an absorption wavelength region of a photothermal conversion material, for example, a wavelength of 750 to 1100 nm, the photothermal conversion material absorbs the light and generates heat. Through thermal welding of organic fine particles by the generated heat, the light-irradiated portion of a photosensitive layer loses hydrophilicity and acquires affinity for ink. In this manner, a lithographic printing plate is produced. Excess irradiation with light or addition of large amount of light absorbers results in elimination or ablation of a photosensitive layer by decomposition or combustion, and decomposed fragments are scattered around the light-irradiation portion. Both excess irradiation with light and addition of large amount of light absorbers should be avoided.

As mentioned above, the hydrophilic property of the light-irradiated portion of a photosensitive layer is changed to have affinity for ink and ink can be attached to the light-irradiated portion without development or wiping off operation. In this way, a lithographic printing original plate of the present invention can be ready for printing.

For irradiation with light to a lithographic printing original plate of the present invention, a light having a wavelength corresponding to a range of wavelength region absorbed by the photothermal conversion material is used, and there is no limitation to the wavelength of the light. On irradiation with light, from the standpoint of irradiation rate, a high speed scanning of converged light is preferable. A light source that is easy to use and has a high output power is suitably used. In this regard, laser beam is suitably used for irradiation, particularly laser beam having an oscillating wavelength in the range of 750 to 1100 nm is preferred. For example, a high power semiconductor laser beam with 830 nm or a YAG laser with 1064 nm is used. An exposing machine equipped with these laser beams has already been commercially available as a so-called thermal plate setter (exposing machine). Further, without irradiation with light, direct irradiation with thermal energy, in the same mechanism as described above, can also lower hydrophilicity of a portion irradiated with thermal energy and give affinity for ink through thermal welding of organic fine particles contained in the photosensitive layer.

EXAMPLES

The present invention will be further described in detail with reference to the following examples. Molecular weights in the examples (weight average molecular weight, Mw) were obtained by GPC measurement. The conditions of the measurement are as follows:

Column: TSKgel SuperAWM-H×2 (TOSOH CORPORATION),
Column temperature: 40° C.,
Mobile phase: 0.1 M NaNO$_3$ aqueous solution,
Flow rate: 0.6 mL/min,
Detection: RI,
Apparatus: 510 high-pressure pump, RI-101 (SHOWA DENKO K.K.),
and
Molecular weight calibration: mono-dispersed PEO (obtained from POLYMER LABORATORIES LTD.).

Brookfield viscosity was measured with a B-type viscometer (BL-type) obtained from TOKI SANGYO CO., LTD. after an aqueous solution of a hydrophilic resin was left for 3 hours in a water bath whose temperature was kept at 25° C. The value obtained for a sample after one minute from the start of viscosity measurement was taken as the Brookfield viscosity of the sample.

Synthesis of Hydrophilic Resins

Synthesis of Hydrophilic Resin P-1 for Cross-Linking

In a flask were charged 335 g of pure water. After dissolved oxygen was removed by bubbling N$_2$ gas, the temperature of the pure water was elevated to 80° C. While flowing N$_2$ gas into the flask, a monomer solution consisting of 63.75 g of acrylamide, 11.25 g of 2-hydroxyethylmethacrylate and 300 g of pure water, and an aqueous solution of initiator obtained by dissolving 0.113 g of potassium persulfate in 40 g of pure water were dropped continuously each separately over 2 hours with keeping the inside temperature of the flask at 80° C. After the completion of dropping, polymerization was continued for 3 hours at 80° C., and then the polymerization solution was cooled and taken out of the flask. The polymerization solution had a solid content of 10%. The molecular weight of the obtained hydrophilic resin P-1 was 660,000 as Mw. An aqueous solution of the hydrophilic resin P-1 had a Brookfield viscosity of 4,500 cps at 25° C.

Synthesis of Hydrophilic Resin P-2 for Cross-Linking

In a flask were charged 335 g of pure water. After dissolved oxygen was removed by bubbling N$_2$ gas, the temperature of the pure water was elevated to 80° C. While flowing N$_2$ gas into the flask, a monomer solution consisting of 67.5 g of acrylamide, 7.5 g of 2-hydroxyethylmethacrylate and 120 g of pure water, and an aqueous solution of initiator obtained by dissolving 0.225 g of potassium persulfate in 47 g of pure water were dropped continuously each separately over 2 hours with keeping the inside temperature of the flask at 80° C. After the completion of dropping, polymerization was continued for 3 hours at 80° C., and then the polymerization solution was cooled and taken out of the flask. The polymerization solution had a solid content of 13%. The molecular weight of the obtained hydrophilic resin P-2 was 450,000 as Mw. An aqueous solution of the hydrophilic resin P-2 had a Brookfield viscosity of 2,200 cps at 25° C.

Synthesis of Hydrophilic Resin P-3 for Cross-Linking

In a flask were charged 335 g of pure water. After dissolved oxygen was removed by bubbling N$_2$ gas, the temperature of the pure water was elevated to 80° C. While flowing N$_2$ gas into the flask, a monomer solution consisting of 60.0 g of acrylamide, 15.0 g of 2-hydroxyethylmethacrylate and 300 g of pure water, and an aqueous solution of initiator obtained by dissolving 0.14 g of potassium persulfate in 40 g of pure water were dropped continuously each separately over 2 hours with keeping the inside temperature of the flask at 80° C. After the completion of dropping, polymerization was continued for 3 hours at 80° C., and then the polymerization solution was cooled and taken out of the flask. The polymerization solution had a solid content of 10%. The molecular weight of the obtained hydrophilic resin P-3 was 520,000 as Mw. An aqueous solution of the hydrophilic resin P-3 had a Brookfield viscosity of 2,200 cps at 25° C.

Synthesis of Hydrophilic Resin P-4 for Cross-Linking

In a flask were charged 335 g of pure water. After dissolved oxygen was removed by bubbling N$_2$ gas, the temperature of the pure water was elevated to 80° C. While flowing N$_2$ gas into the flask, a monomer solution consisting of 56.25 g of acrylamide, 18.75 g of 2-hydroxyethylmethacrylate and 300 g of pure water, and an aqueous solution of initiator obtained by dissolving 0.225 g of potassium persulfate in 40 g of pure water were dropped continuously each separately over 2 hours with keeping the inside of the flask at 80° C. After the completion of dropping, polymerization was continued for 3 hours at 80° C., and then the polymerization solution was cooled and taken out of the flask. The polymerization solution had a solid content of 10%. The molecular weight of the obtained hydrophilic resin P-4 was 330,000 as Mw. An aqueous solution of the hydrophilic resin P-4 had a Brookfield viscosity of 320 cps at 25° C.

Synthesis of Hydrophilic Resin Q-1 for Non-Cross-Linking

In a flask were charged 335 g of pure water. After dissolved oxygen was removed by bubbling N$_2$ gas, the temperature of the pure water was elevated to 80° C. While flowing N$_2$ gas into the flask, an initiator/monomer solution consisting of 74.25 g of acrylamide, 75 g of pure water, 0.75 g of sodium methallylsulfonic acid, and 0.75 g of potassium persulfate was dropped continuously over 2 hours with keeping the inside temperature of the flask at 80° C. After the completion of dropping, polymerization was continued for 3 hours at 80° C., and then the polymerization solution was cooled and taken out of the flask. The polymerization solution had a solid content of 15%. The molecular weight of the obtained hydrophilic resin Q-1 was 390,000 as Mw. An aqueous solution of the hydrophilic resin Q-1 had a Brookfield viscosity of 600 cps at 25° C.

Synthesis of Hydrophilic Resin Q-2 for Non-Cross-Linking

In a flask were charged 600 g of pure water. After dissolved oxygen was removed by bubbling N$_2$ gas, the temperature of the pure water was elevated to 80° C. While flowing N$_2$ gas into the flask, an initiator/monomer solution consisting of 75 g of acrylamide, 75 g of pure water, and 0.75 g of potassium persulfate was dropped continuously over 2 hours with keeping the inside of the flask at 80° C. After the completion of dropping, polymerization was still continued for 3 hours at 80° C., and then the polymerization solution was cooled and taken out of the flask. The polymerization solution had a solid content of 10%. The molecular weight of the resultant hydrophilic resin Q-2 was 240,000 as Mw. An aqueous solution of the hydrophilic resin Q-2 had a Brookfield viscosity of 300 cps at 25° C.

Example 1

An aqueous solution of hydrophilic resins, a cross-linking agent, organic fine particles, and a photothermal conversion material were mixed at room temperature in a composition described below to obtain an aqueous solution of a photosensitive resin composition. Herein, "part (s)" described below means "part(s) by weight" of a solid content of each resin or compound.
  Hydrophilic resin P-1: 17 parts;
  Hydrophilic resin Q-1: 12 parts;
  Methylated melamine resin (Cymel 385™, obtained from MITSUI CYTEC INC.): 25 parts;
  Urethane fine particles (emulsion OLESTER UD350, obtained from MITSUI CHEMICALS, INC.): 29 parts;
  Cyanine dye ($\lambda_{max}$=784 nm, $\epsilon$max=2.43×10$^5$ Lmol$^{-1}$cm$^{-1}$ in a methanol solution): 17 parts; and
  Anionic surfactant (NEOCOL YSK™, obtained from DAI-ICHI KOGYO SEIYAKU CO., LTD.): 0.2 part.

The aqueous solution of the photosensitive resin composition was coated on a 0.2 mm thick polyester film with a doctor blade. After the obtained photosensitive layer was dried at 25° C. for 15 minutes, it was heated at 140° C. for 15 minutes. The photosensitive layer was cross-linked and subjected to film casting to obtain Lithographic printing original plate 1 with a 2 μm thick photosensitive layer.

On the obtained plate was irradiated a semiconductor laser beam having a wavelength of 830 nm by scanning while converging the laser beam so as to achieve the irradiation energy density of 230 mJ/cm$^2$, to draw an image information of 200 lines/inch and thus the Lithographic printing plate 1 was obtained. The surface of non-image areas of the printing plate was observed with an optical microscope equipped with a CCD camera and a scanning electron microscope. The images of the non-image areas are shown in FIG. 1 and FIG. 2. A sea-island phase-separation structure was confirmed on the surface of the plate, and the island portion had a shape of quasi-circular. On the observation with the optical microscope, the surface of the plate was observed after the surface was slightly wiped with cotton swamped with pure water so as to have a clear contrast. The island portion of the image obtained from the picture of the optical microscope was subjected to image analysis using an image processing software of Planetron Image-Pro Plus in an area of 2500 μm$^2$. In an area of 2500 μm$^2$, 241 of island portions having short axes of 0.5 μm or more to 10 μm or less were counted. The mean value of the diameters (short axes) was 1.9 μm. Another Lithographic printing plate 1 prepared and drawn in a similar manner as described above was mounted on an offset printing machine using a fountain solution (SPRINT26, available from KOMORI CORPORATION), and 10,000 sheets were printed using an ink of HYECOO SOY™ available from TOYO INK MFG. CO., LTD. and as a fountain solution a 3% aqueous solution of ASTROMARK3™ available from NIKKEN CHEMICAL LABORATORY CO., LTD.). Good printed images were obtained. After that, an ink was coated on the entire surface of the printing plate, and then printing was carried out so as to examine recovery from ink staining. At the 20th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. FIG. 3 shows a picture of the non-image areas of the plate after printing observed by scanning electron microscope. As compared with a picture before printing observed by scanning electron microscope, voids derived from a part of the island portions were observed.

It was identified that the composition constituting the island portion was leached out and produced recessed parts in the course of printing process.

Comparative Example 1

Regarding photosensitive resin composition, an aqueous solution of a photosensitive resin composition was prepared in the same composition as described in Example 1 except adding 29 parts of hydrophilic resin P-1 without adding hydrophilic resin Q-1. Lithographic printing original plate 2 was prepared in a similar manner as described in Example 1 and the plate was subjected to drawing to obtain Lithographic printing plate 2, and the performance of Lithographic printing plate 2 was evaluated. Ten thousands of sheets were printed. Good printed images were obtained. After that, an ink was coated on the entire surface of the printing plate, and then printing was carried out so as to examine recovery from ink staining. Even after 300 sheets were printed, ink staining on non-image areas did not fully disappear and over 85% of halftone dot areas were found to still have splitting of ink. The surface of printing plate was also observed by scanning electron microscope before and after printing. FIG. 4 shows a picture of non-image areas of Lithographic printing plate 2 after printing. As clear from the figure, the surface condition of the plate was definitely different from that of the plate as shown in Example 1. A phase-separation structure in a μm scale was not observed either before or after printing.

Example 2

Regarding photosensitive resin composition, an aqueous solution of a photosensitive resin composition was prepared in the same composition as described in Example 1 except using 11 parts of hydrophilic resin P-2 and 18 parts of hydrophilic resin Q-1 in place of hydrophilic resin P-1. Lithographic printing original plate 3 was prepared in a similar manner as described in Example 1 and the plate was subjected to drawing to obtain Lithographic printing plate 3. The surface of the printing plate 3 was observed by optical microscope in a similar manner as described in Example 1, a sea-island phase-separation structure was identified and the island portion had a shape of quasi-circular. The image was subjected to image analysis in a similar manner as described in Example 1, and 312 of island portions having short axes of 0.5 μm or more to 10 μm or less were counted in an area of 2,500 μm$^2$. The mean value of the diameters (short axes) was 0.8 μm. Another Lithographic printing plate 3 was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 30th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 3

Regarding photosensitive resin composition, an aqueous solution of a photosensitive resin composition was prepared in the same composition as described in Example 1 except using 11 parts of hydrophilic resin P-1 and 18 parts of hydrophilic resin Q-2 in place of hydrophilic resin Q-1. Printing original plate 4 was prepared in a similar manner as described in Example 1 and the plate was subjected to drawing to obtain Lithographic printing plate 4. The surface of the printing plate 4 was observed by optical microscope a sea-island phase-separation structure was identified and the island portion had a shape of quasi-circular. Then the image was subjected to image analysis in a similar manner as described in Example 1, and 271 of island portions having short axes of 0.5 μm or more to 10 μm or less were counted in an area of 2,500 μm². The mean value of the diameters (short axes) was 0.9 μm. Another Lithographic printing plate was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 60th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 4

Regarding photosensitive resin composition, an aqueous solution of a photosensitive resin composition was prepared in the same composition as described in Example 1 except using 24 parts of P-1 and 5 parts of Q-1. Lithographic printing original plate 5 was prepared in a similar manner as described in Example 1 and the plate was subjected to drawing to obtain Lithographic printing plate 5. The surface of the printing plate 5 was observed by optical microscope a sea-island phase-separation structure was identified and the island portion had a shape of quasi-circular. The image was subjected to image analysis in a similar manner as described in Example 1, and 122 of island portions having short axes of 0.5 μm or more to 10 μm or less were counted in an area of 2,500 μm². The mean value of the diameters (short axes) was 0.7 μm. Another Lithographic printing plate 5 was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 60th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 5

Regarding photosensitive resin composition, an aqueous solution of a photosensitive resin composition was prepared in the same composition as described in Example 1 except using hydrophilic resin P-3 in place of hydrophilic resin P-1. Lithographic printing original plate 6 was prepared in a similar manner as described in Example 1 and the plate was subjected to drawing to obtain Lithographic printing plate 6. The surface of the printing plate 6 was observed by optical microscope, a sea-island phase-separation structure was identified and the island portion had a shape of quasi-circular. The image was subjected to image analysis in a similar manner as described in Example 1, and 132 of island portions having short axes of 0.5 μm or more to 10 μm or less were counted in an area of 2,500 μm². The mean value of the diameters (short axes) was 2.7 μm. Another Lithographic printing plate 6 was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 20th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 6

An aqueous solution of hydrophilic resins, a cross-linking agent, organic fine particles, and a light-absorber were mixed at room temperature in a composition described below to obtain an aqueous solution of a photosensitive resin composition.

Hydrophilic resin P-2: 25 parts;
Hydrophilic resin Q-2: 13 parts;
Methylated melamine resin (Cymel 385™, obtained from MITSUI CYTEC LTD.): 25 parts;
Urethane fine particles (emulsion OLESTER UD350™, obtained from MITSUI CHEMICALS, INC.): 20 parts;
Cyanine dye ($\lambda_{max}$=784 nm, $\epsilon$max=2.43×10⁵ Lmol⁻¹cm⁻¹ in a methanol solution): 17 parts; and
Anionic surfactant (NEOCOL YSK™, obtained from DAI-ICHI KOGYO SEIYAKU CO., LTD.): 0.2 part.

After that, Lithographic printing original plate 7 was prepared in a similar manner as described in Example 1 and the plate was subjected to drawing to obtain Lithographic printing plate 7. The surface of the printing plate 7 was observed by optical microscope, a sea-island phase-separation structure was identified and the island portion had a shape of quasi-circular. The image was subjected to image analysis in a similar manner as described in Example 1, and 113 of island portions having short axes of 0.5 μm or more to 10 μm or less were counted in an area of 2,500 μm². The mean value of the diameters (short axes) was 2.2 µm. Another Lithographic printing plate 7 was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 40th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 7

Regarding photosensitive resin composition, an aqueous solution of a photosensitive resin composition was prepared in the same composition as described in Example 1 except using a cyanine dye having a $\lambda_{max}$ of 784 nm and a $\lambda_{max}$ of $2.04 \times 10^5$ $Lmol^{-1}cm^{-1}$ in a methanol solution (trade name: ADS785WS, obtained from NIHON SIBERHEGNER K.K.) as a dye. Lithographic printing original plate 8 was prepared in a similar manner as described in Example 1 and the plate was subjected to drawing to obtain Lithographic printing plate 8. The surface of the printing plate 8 was observed by optical microscope, a sea-island phase-separation structure was identified and the island portion had a shape of quasi-circular. The image was subjected to image analysis in a similar manner as described in Example 1, and 215 of island portions having short axes of 0.5 µm or more to 10 µm or less were counted in an area of 2,500 µm². The mean value of the diameters (short axes) was 1.8 µm. Another Lithographic printing plate 8 was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 20th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 8

Regarding photosensitive resin composition, an aqueous solution of a photosensitive resin composition was prepared in the same composition as described in Example 1 except using hydrophilic resin P-3 in place of hydrophilic resin P-1. The aqueous solution of a photosensitive resin composition was coated with a doctor blade on a 0.2 mm thick polyester film. The coating was dried at 60° C. for 1 minute, and then heated at 130° C. for 25 minutes to form a 2 µm thick photosensitive layer and to obtain Lithographic printing original plate 9. After that, the plate was subjected to drawing to obtain Lithographic printing plate 9 in a similar manner as described in Example 1. The surface of the printing plate 9 was observed by optical microscope. A sea-island phase-separation structure was identified on the surface of the printing plate in which the island portion had a shape of quasi-circular as shown in FIG. 5. The image was subjected to image analysis in a similar manner as described in Example 1, and 223 of island portions having short axes of 0.5 µm or more to 10 µm or less were counted in an area of 2,500 µm². The mean value of diameters was 1.7 µm for the short axes and 4.0 µm for the long axes. Another Lithographic printing plate 9 was prepared and drawn in a similar manner as described above, and the performance of printing was evaluated. Ten thousands of sheets were printed. Good printed images were obtained. After that, the ink was coated on the entire surface of the printing plate, and then printing was carried out so as to examine recovery from ink staining. At the 20th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 9

Regarding photosensitive resin composition, an aqueous solution of a photosensitive resin composition was prepared in the same composition as described in Example 8 except using hydrophilic resin P-4 in place of hydrophilic resin P-3. Lithographic printing original plate 10 was prepared in a similar manner as described in Example 8 and the plate was subjected to drawing to obtain Lithographic printing plate 10. The surface of the printing plate 10 was observed by optical microscope in a similar manner as described in Example 1, a sea-island phase-separation structure was identified and the shape of island portion was elliptical. The image was subjected to image analysis in a similar manner as described in Example 1, and 41 of island portions having short axes of 0.5 µm or more to 10 µm or less were counted in an area of 2,500 µm². The mean value of diameters was 3.8 µm for the short axis and 6.3 µm for the long axis. Another Lithographic printing plate 3 was prepared and drawn in a similar manner as described above, and the performance of printing was evaluated. Five thousands of sheets were printed. Good printed images were obtained. After that, an ink was coated on the entire surface of the printing plate, and then printing was carried out so as to examine recovery from ink staining. At the 20th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

Example 10

On a 0.24 mm thick aluminum plate was coated an aqueous solution of a water-dispersing urethane resin (OLESTER UD350™ having a solid content of 40% by weight, obtained from MITSUI CHEMICALS, INC.) with a wire bar, and then the coating was dried at 150° C. for 10 minutes to obtain a underlying layer. The photosensitive solution used in Example 1 was coated on the underlying layer with a wire bar, and then the coating was dried at 140° C. for 20 minutes to form approximately 2 µm thick photosensitive layer and to obtain Lithographic printing original plate 11. After that, the plate was subjected to drawing to obtain Lithographic printing plate 11 in a similar manner as described in Example 1. The surface of the printing plate 11 was observed by optical microscope in a similar manner as described in Example 1, a sea-island phase-separation structure was identified and the island portion had a shape of quasi-circular. The image was subjected to image analysis in a similar manner as described in Example 1, and 220 of island portions having short axes of 0.5 µm or more to 10 µm or less were counted in an area of 2,500 µm². The mean value of the diameters (short axes) was 1.8 µm. Another Lithographic printing plate 11 was prepared and drawn in a similar manner as described above, and the performance of printing was evaluated. Ten thousands of sheets were printed. Good printed images were obtained. After that, an ink was coated on the entire surface of the printing plate, and then printing was carried out so as to examine recovery from ink staining. At the 20th sheet of paper printed, ink staining on the non-image areas disappeared and 96% of halftone dot areas were also found to be free from splitting of ink. Good recovery from ink staining was identified. Further, the surface of the plate after printing was observed with a scanning electron microscope. Voids derived from a part of the island portions were observed and it was identified that the composition constituting the island portion was leached out and produced recessed parts in the course of printing process.

INDUSTRIAL APPLICABILITY

According to the present invention, a lithographic printing original plate having a photosensitive layer is provided, which is sensitive to near-infrared light, can be drawn directly by laser beam, and is free from development and wiping off operation, wherein ink-staining is easy to disappear when ink is attached to non-image areas in the course of printing, and is also provided a lithographic printing plate which is prepared from the lithographic printing original plate.

BRIEF DESCRIPTION OF THE DRAWINGS

FIG. 1 is an image of the surface of non-image areas of Lithographic printing plate 1 observed by optical microscope. Magnification is 3,000 times.

FIG. 2 is an image of the surface of non-image areas of Lithographic printing plate 1 observed by scanning electron microscope. Magnification is 2,000 times.

FIG. 3 is an image of the surface of non-image areas of Lithographic printing plate 1 after printing observed by scanning electron microscope. Magnification is 2,000 times.

FIG. 4 is an image of the surface of non-image areas of Lithographic printing plate 2 after printing observed by scanning electron microscope. Magnification is 2,000 times.

FIG. 5 is an image of the surface of non-image areas of Lithographic printing plate 9 observed by optical microscope. Magnification is 3,000 times.

The invention claimed is:

1. A lithographic printing original plate having a photosensitive layer formed on a support,
   wherein the photosensitive layer comprises the heat cured product of a photosensitive resin composition,
   wherein the photosensitive layer has a phase-separation structure in a sea-island form,
   wherein the photosensitive resin composition comprises a hydrophilic resin having cross-linking groups that can react with a cross-linking agent, a hydrophilic resin having no functional groups that can react with a cross-linking agent and which can dissolve out in water, a melamine resin, organic fine particles and a photothermal conversion material,
   wherein the hydrophilic resin having cross-linking groups that can react with a cross-linking agent is obtained by polymerizing a monomer containing a cross-linking monomer having a hydroxyl group,
   wherein an island portion in the sea-island form comprises the hydrophilic resin having no functional group and has a mean diameter value of from 0.5 µm to 10 µm, and
   wherein the hydrophilic resin having no functional groups that can react with a cross-linking agent is obtained by polymerizing at least one monomer containing a N-alkyl or N-alkylene substituted (meth)acrylamide compound selected from the group consisting of monomers represented by formulae (1) and (2),
   formula 1

wherein $R_1$ represents a hydrogen atom or a methyl group, and $R_2$ and $R_3$ each individually represents a hydrogen atom or a lower alkyl or alkoxy group,
formula 2

wherein $R_1$ represents a hydrogen atom or a methyl group, and A represents $(CH_2)_n$, and
wherein n represents an integer of 4 to 6 or $(CH_2)_2O(CH_2)_2$.

2. A lithographic printing original plate according to claim 1, wherein there are at least five island portions having a diameter of 0.5 µm or more to 10 µm or less in an area of 2,500 µm² on any surface of the photosensitive layer, wherein the diameter means a short axis when the island portion has an elliptic shape with a long axis and a short axis, and at least a part of the island portions produces recessed parts on the surface of the lithographic printing original plate after printing when the plate is subjected to printing using a fountain solution.

3. A lithographic printing original plate according to claim 2, wherein the mean value of the short axes of the island portions is 0.5 µm or more to 10 µm or less.

4. A lithographic printing original plate according to claim 1, wherein the hydrophilic resin having no functional groups that can react with a cross-linking agent is obtained by further reacting one or more kinds of compounds selected from compounds having following general formula (3) or salts thereof:

[formula 3]

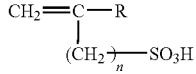
(3)

wherein R represents a hydrogen atom or a lower alkyl group; n represents an integer of 1 to 8.

5. A photosensitive resin composition comprising:
a hydrophilic resin for cross-linking, having cross-linking groups that can react with a cross-linking agent, obtained by polymerizing a monomer containing a cross-linking monomer having a hydroxyl group,
a hydrophilic resin for non-cross-linking, having no functional groups that can react with a cross-linking agent, obtained by polymerizing at least one monomer containing a N-alkyl or N-alkylene substituted (meth)acrylamide compound selected from the group consisting of monomers represented by formulae (1) and (2),
formula 1

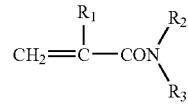
(1)

wherein $R_1$ represents a hydrogen atom or a methyl group, and $R_2$ and $R_3$ each individually represents a hydrogen atom or a lower alkyl or alkoxy group, formula 2

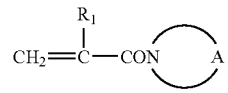
(2)

wherein $R_1$ represents a hydrogen atom or a methyl group, A represents $(CH_2)_n$, and n represents an integer of 4 to 6 or $(CH_2)_2O(CH_2)_2$,
a melamine resin,
organic fine particles, and
a photothermal conversion material.

* * * * *